United States Patent
Bösch et al.

(10) Patent No.: US 12,127,329 B2
(45) Date of Patent: Oct. 22, 2024

(54) FLEXIBLE CIRCUIT BOARD WITH THERMALLY CONDUCTIVE CONNECTION TO A HEAT SINK

(71) Applicants: HELLA GMBH & CO KGAA, Lippstadt (DE); INFINITE FLEX GMBH, Neu-Isenburg (DE)

(72) Inventors: Dirk Bösch, Lippstadt (DE); Kangkai Ma, Friedrichsdorf (DE)

(73) Assignees: HELLA GMBH & CO KGAA, Lippstadt (DE); INFINITE FLEX GMBH, Oberursel (DE)

( * ) Notice: Subject to any disclaimer, the term of this patent is extended or adjusted under 35 U.S.C. 154(b) by 262 days.

(21) Appl. No.: 17/612,010

(22) PCT Filed: May 29, 2020

(86) PCT No.: PCT/EP2020/065007
§ 371 (c)(1),
(2) Date: Nov. 17, 2021

(87) PCT Pub. No.: WO2020/249409
PCT Pub. Date: Dec. 17, 2020

(65) Prior Publication Data
US 2022/0225491 A1 Jul. 14, 2022

(30) Foreign Application Priority Data
Jun. 12, 2019 (DE) ...................... 10 2019 116 021.9

(51) Int. Cl.
*H05K 1/02* (2006.01)
*H05K 1/11* (2006.01)
(Continued)

(52) U.S. Cl.
CPC ............ *H05K 1/0204* (2013.01); *H05K 1/118* (2013.01); *H05K 3/0061* (2013.01); *H01L 33/64* (2013.01);
(Continued)

(58) Field of Classification Search
CPC ..... H01L 33/64; H01L 33/647; H05K 1/0204; H05K 1/0207; H05K 1/118; H05K 1/189;
(Continued)

(56) References Cited

U.S. PATENT DOCUMENTS 9,445,490 B2   9/2016   Waegli
2008/0111944 A1   5/2008   Sakai
(Continued)

FOREIGN PATENT DOCUMENTS

CN   105009692 A   10/2015
EP   2416630 A1    2/2012
(Continued)

OTHER PUBLICATIONS

Machine translation completed Oct. 17, 2023, WO-2017098910-A1 by Motoki et al (Year: 2023).*
(Continued)

*Primary Examiner* — Zachary Pape
*Assistant Examiner* — Steven Ngo
(74) *Attorney, Agent, or Firm* — LUCAS & MERCANTI, LLP

(57) ABSTRACT

A flexible circuit board includes an electrically insulating cover layer, at least one electrical component arranged on the upper side of the cover layer with electrical contacts, a conducting track structure arranged on the underside of the cover layer and with contact regions, wherein the electrical contacts are each electrically conductively connected to one of the contact regions through one of a plurality of openings in the cover layer, a heat sink which is thermally conduc-
(Continued)

tively connected to each electrical component through the cover layer, and a layer with high conductivity. To create an improved cooling capacity of the electrical component, the heat arising in the electrical components is first dissipated effectively within the conducting paths of the conducting path structure and then dissipated out of the conducting paths directly into the heat sink by the layer with high heat conductivity.

13 Claims, 2 Drawing Sheets

(51) Int. Cl.
*H05K 3/00* (2006.01)
*H01L 33/64* (2010.01)
*H05K 1/18* (2006.01)
*H05K 7/20* (2006.01)

(52) U.S. Cl.
CPC .......... *H01L 33/647* (2013.01); *H05K 1/0207* (2013.01); *H05K 1/189* (2013.01); *H05K 7/205* (2013.01); *H05K 2201/0187* (2013.01); *H05K 2201/0195* (2013.01); *H05K 2201/066* (2013.01); *H05K 2201/099* (2013.01); *H05K 2201/09909* (2013.01); *H05K 2201/10106* (2013.01); *H05K 2203/0522* (2013.01)

(58) Field of Classification Search
CPC ................. H05K 3/0061; H05K 7/205; H05K 2201/0187; H05K 2201/0195; H05K 2201/066; H05K 2201/099; H05K 2201/09909; H05K 2201/10106; H05K 2203/0522

See application file for complete search history.

(56) References Cited

U.S. PATENT DOCUMENTS

| | | | |
|---|---|---|---|
| 2013/0039013 A1* | 2/2013 | Waegli | G02B 6/383 156/60 |
| 2013/0083540 A1 | 4/2013 | Lo | |
| 2014/0268780 A1* | 9/2014 | Wang | H05K 1/028 362/249.06 |
| 2015/0369467 A1* | 12/2015 | Saito | H05K 3/0011 362/345 |
| 2016/0308101 A1* | 10/2016 | Konishi | H01L 33/62 |
| 2018/0212129 A1* | 7/2018 | Saito | H05K 1/02 |

FOREIGN PATENT DOCUMENTS

| | | | | |
|---|---|---|---|---|
| EP | 2548419 B1 | 1/2013 | | |
| WO | WO-2017098910 A1 * | 6/2017 | | H05K 1/02 |

OTHER PUBLICATIONS

WIPO search opinion for EP 2020/065007 (Year: 2020).*
English Translation of International Preliminary Report on Patentability Dated Dec. 1, 2014, 2021, 6 Pages.
Machine English translation of Motoki, 21 pages.

* cited by examiner

FLEXIBLE CIRCUIT BOARD WITH THERMALLY CONDUCTIVE CONNECTION TO A HEAT SINK

CROSS-REFERENCE TO RELATED APPLICATIONS

This application is a 371 of PCT/EP2020/065007, filed May 29, 2020, which in turn claims the priority of DE 10 2019 116 021.9 filed Jun. 12, 2019. The priority of both applications is hereby claimed and both applications are incorporated herein by reference.

BACKGROUND OF THE INVENTION

The invention relates to a flexible circuit board comprising
an electrically insulating cover layer,
at least one electrical component with electrical contacts arranged on the upper side of the cover layer,
a conductive track structure with contact regions arranged on the lower side of the cover layer,
openings in the cover layer, wherein the contacts are each electrically conductively connected to one of the contact regions through one of the openings, and
a heat sink that is thermally conductively connected through the cover layer to the electrical component.

Thin, flexible circuit boards, known as flex circuit boards, based, for example, on polyimide or polyester foils, are used as an alternative to rigid circuit boards. The circuits constructed therewith can be employed in a space-saving manner in very tight structures. Flexible circuit boards are used, for example, in automotive technology.

A generic flexible circuit board that can be employed for the wiring and connection of light-emitting diodes is known from EP 2 548 419 B1. Due to the high powers on a very small area, a low boundary layer temperature of the light-emitting diodes is essential, since a raised boundary layer temperature has the consequence of a reduction in the service life and light output of the light-emitting diodes. The efficiency falls with rising temperature, so that the light yield falls depending on the type of cooling. For this reason it is particularly important that the best possible thermal connection is established between the light-emitting diodes and a heat sink, in order to dissipate the heat arising in the light-emitting diode as effectively as possible.

For the sake of effective heat dissipation, the flexible circuit board known from EP 2 548 419 B1 consists of a foil system consisting of an insulating carrier layer, a metal foil and an insulating cover layer. The metal foil serves as an electrical conductor for the connection and wiring of the light emitting diodes; it is divided into various regions, so that the necessary conductive track structure is formed. The light-emitting diodes are mounted on the cover layer of this foil system. The electrical contacts of each light-emitting diode are connected to the conductive track structure through openings in the cover layer by means of a solder joint or of an electrically conductive adhesive. The insulating carrier layer is laminated onto a three-dimensional structure designed as a heat sink. The cover layer and the carrier layer have further openings at those points at which a thermal connection between the light-emitting diodes and the heat sink is established. A thermally conductive adhesive or a solder joint forms the thermally conductive connection between the light-emitting diode and the heat sink through the further openings. The heat produced by each light-emitting diode is thus passed via the thermally conductive adhesive or the solder joint into the heat sink.

BRIEF SUMMARY OF THE INVENTION

On the basis of this prior art, the invention is based on the object of creating a flexible circuit board having an electrically insulating cover layer and a conductive track structure with improved cooling capacity for electrical components, light-emitting diodes in particular, mounted thereon.

The solution is based on the idea of initially spreading the heat arising in the light-emitting diodes effectively within the conductive tracks of the conductive track structure, and then dissipating it from the conductive tracks directly into the heat sink.

To avoid short-circuits between the conductive tracks of the conductive track structure, an electrically insulating layer is arranged between the mainly metallic heat sink and the lower side of the cover layer with the conductive track structure arranged thereon in such a way that at least the conductive track structure arranged on the cover layer is completely electrically insulated from the heat sink. The insulating layer preferably extends over the entire area of the entire lower side of the cover layer.

At least underneath the contact regions of the conductive track structure that abut the contacts of the light-emitting diodes, the electrically insulating layer consists of a material with a thermal conductivity of at least 1 W/(mK), preferably 3 W/(mK), in order to provide a direct thermal connection between the contact regions and the heat sink. In the other regions, the electrically insulating layer consists, at least partially but preferably completely, of a material with an adhesive effect in order to fasten the cover layer with the conductive track structure applied thereon to the heat sink.

It is not essential according to the invention that the material of the electrically insulating layer in the regions of the thermal connection with a higher thermal conductivity has an adhesive effect. The fastening can be achieved exclusively through the other regions of the electrically insulating layer. Nevertheless, it is not to be ruled out that, in regions of the thermal connection, the electrically insulating layer is formed of an electrically insulating, thermally conductive adhesive with a thermal conductivity in the claimed range.

In that, in regions of the thermal connection, the electrically insulating layer has the claimed thermal conductivity of at least 1 W/(mK), it is possible according to the invention to dissipate the heat that has been dispersed into the conductive track structure from the highly thermally stressed contacts of the light-emitting diodes, efficiently and directly into the heat sink, exclusively via the electrically insulating layer. For this purpose the flexible circuit board entirely dispenses with a carrier foil arranged on the lower side of the conductive track structure, particularly underneath the contacts of the light-emitting diodes and the contact regions of the conductive track structure that abut them. Dispensing with the usual carrier foils of PI, PET or PEN which, with a thermal conductivity of at best 0.52 W/(mK), obstruct the heat conduction, permits the direct and highly efficient dissipation of heat directly via the electrically insulating layer from the contact regions of the light-emitting diodes.

The conductive track structure is, for example, manufactured of a metal foil with a thickness of 50 µm-300 µm. In order to enable a high-resolution structuring of the conductive tracks with these layer thicknesses, a self-supporting metal foil, in particular of aluminum, is preferably used as a starting material in the place of the copper that is usual in the prior art. The conductive track structure can, however, also consist of copper and/or tin and/or alloys of the aforesaid metals.

The supporting layer of the flexible circuit board is the cover layer, which is arranged between the electrical components and the conductive track structure.

The solderability of the contact regions of the conductive track structure can be improved in that the contact regions are metalized with easily wettable metals by means of atmospheric plasmas. If the conductive track structure consists of aluminum, the solderability of the contact regions is created by metalizing the contact regions, for example with copper.

The thickness of the electrically insulating layer is preferably determined in that the parallel spacing between the lower side of the cover layer and the surface of the heat sink is constant.

The regions of the electrically insulating layer with a thermal conductivity of at least 1 W/(mK) for creating the thermal connection preferably have a slightly greater thickness than the electrically insulating layer in the other regions. This ensures that the adhesive effect of the other regions of the electrically insulating layer reliably fixes the regions with a thermal conductivity of at least 1 W/(mK) for creating the thermal connection between the lower side of the conductive track structure and the surface of the heat sink, and thereby improves the transfer of heat from the contact regions into the electrically insulating layer and from the electrically insulating layer into the heat sink.

The electrically insulating layer with a thermal conductivity of at least 1 W/(mK) is, in a first embodiment of the invention, a thermally conductive foil that lies directly at least against the contact regions on the one side and against the surface of the heat sink on the other side, i.e. without an adhesive layer applied to the foil on one or both sides.

The electrically insulating layer of a material with an adhesive effect consists in the first embodiment preferably also of a foil whose surface at least partially, and preferably over the entire area, comprises an adhesive layer on both sides. The material only has a low thermal conductivity.

The electrically insulating layer with a thermal conductivity of at least 1 W/(mK) is, in a second embodiment of the invention, a thermally conductive paste that is in contact at least with the contact regions on the one side and the surface of the heat sink on the other side.

The electrically insulating layer of a material with an adhesive effect is, in the second embodiment of the invention, preferably exclusively an adhesive layer having a thickness in a range between 100 µm and 500 µm. Deviating from the prior art, the second embodiment therefore does not need any foil between the conductive track structure and the heat sink, whereby the effort for the manufacture of the flexible circuit board is reduced.

The electrically insulating layer with a thermal conductivity of at least 1 W/(mK) is, for example, a ceramic-filled thermally conductive paste or foil.

The heat sink is preferably a metallic cooling element to the surface of which the adhesive layer is applied.

BRIEF DESCRIPTION OF THE DRAWINGS

The invention is described with reference to an exemplary embodiment below. Here

DETAILED DESCRIPTION OF THE PREFERRED EMBODIMENTS

Figure 1:
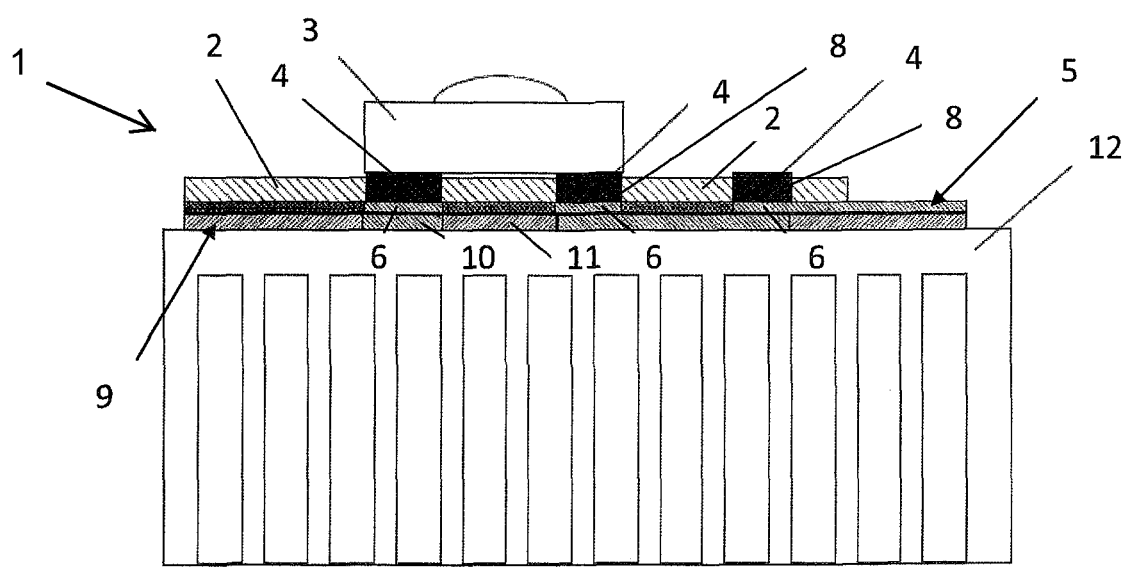
FIG. 1 shows a schematic side view of a flexible circuit board with heat sink according to an embodiment of the invention.

FIG. 1 shows a flexible circuit board 1 according to the invention with an electrically insulating cover layer 2 of plastic, for example of polyimide. The cover layer prevents a short circuit between the conductive tracks of a conductive track structure 5 when handling the flexible circuit board 1. Only one electrical component 3 in the form of a light-emitting diode is arranged, by way of example, on the upper side of the cover layer 2. The light-emitting diode has two electrical contacts 4 on its lower side. The contacts 4 are the anode and cathode of the light-emitting diode.

The conductive track structure 5, which comprises a plurality of conductive tracks, is attached to a lower side of the cover layer 2. The conductive track structure 5 comprises contact regions 6 that can be wetted effectively by a solder 8. A metallization of the contact regions 6 may be necessary, depending on the material of the conductive track structure 5.

Openings 7 are provided in the cover layer 2, wherein the electrical contacts 4 of the light-emitting diode are each electrically conductively connected through one of the openings 7 with a contact region 6 of the conductive track structure 5. Each opening 7 is aligned with an electrical contact 4 of the light-emitting diode (electrical component 3) and with a contact region 6 of the conductive track structure 5.

Figure 2A:
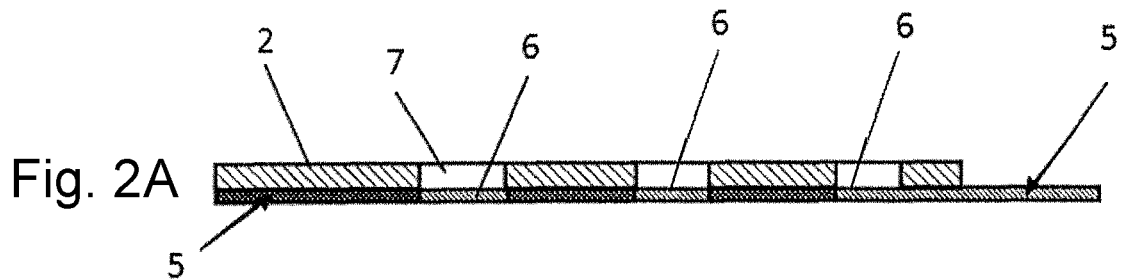
FIG. 2A shows a cover layer with a conductive track structure of the flexible circuit board according to FIG. 1.
Figure 2B:
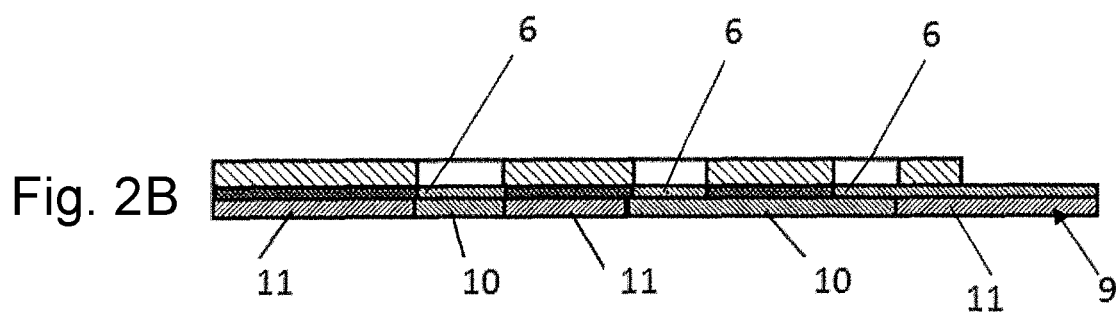
FIG. 2B shows the cover layer with the conductive track structure according to FIG. 2A, as well as an electrically insulating layer.

The lower side of the cover layer 2 with the conductive track structure 5 attached to it is provided over its entire area with an electrically insulating layer 9 (FIG. 2B), so that the conductive track structure 5 is completely electrically insulated.

The electrically insulating layer 9 has first regions 10 of a material with a thermal conductivity of at least 1 W/(mK) and second regions 11 of a material with a significantly lower thermal conductivity but with, however, an adhesive effect between the lower side of the cover layer 2 with the conductive track structure 5 attached to it and a surface of a heat sink 12.

The first regions 10 with higher thermal conductivity are located underneath the contact regions 6 of the conductive track structure 5 in order to establish a direct thermal connection of the conductive track structure 5, along with the highly thermally stressed electrical contacts 4 of the light-emitting diodes (electrical components 3) that are in contact therewith, to the heat sink 12.

Figure 2C:
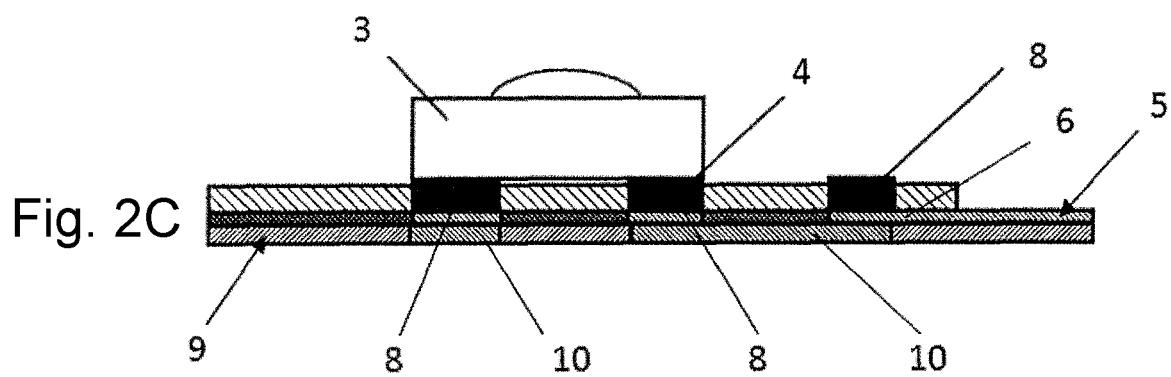
FIG. 2C shows the cover layer with the conductive track structure and the electrically insulating layer according to FIG. 2B, as well as an electrical component arranged on the upper side of the cover layer.
Figure 2D:
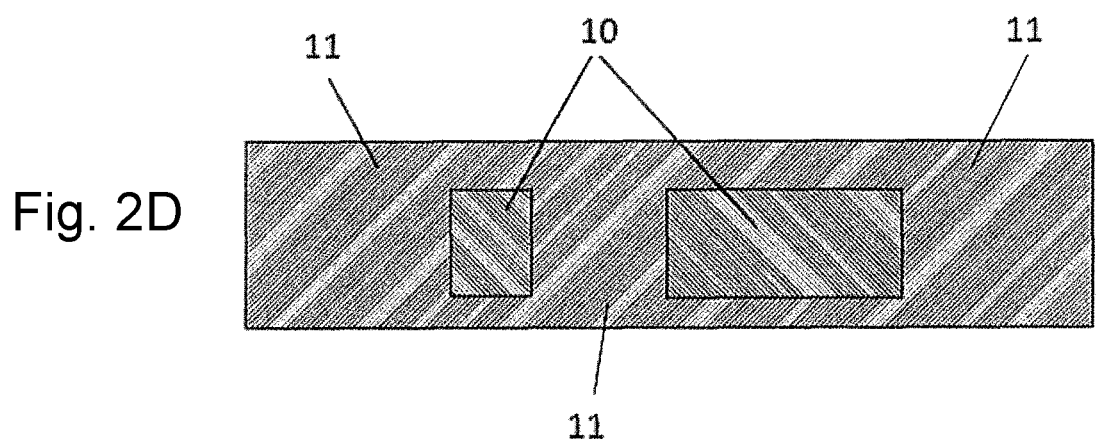
FIG. 2D shows a view from below of the electrically insulating layer according to FIG. 2C.

The first regions 10 with higher thermal conductivity can, for technical reasons associated with manufacture, also be arranged underneath the conductive tracks of the conductive track structure 5 and of the cover layer 2. In the view of FIG. 2D in combination with FIG. 2C, it can be seen that the first region 10 with raised thermal conductivity, shown on the left in the figures, is arranged entirely underneath the contact region 6, while the first region 10 with raised thermal conductivity shown on the right in the figures is arranged underneath two contact regions 6 of the conductive track structure 5 as well as of the cover layer 2.

The second regions 11 with adhesive effect surround the first regions 10 with raised thermal conductivity, and, due to the adhesive effect, serve to bond the insulating layer 9 and the cover layer 2 with the conductive track structure 5 to the surface of the heat sink 12 designed as a cooling element.

In order to join the electrical contacts 4 of the light-emitting diode to the contact regions 6 of the conductive track structure 5, the solder 8, for example in the form of a solder paste, is first applied to the contact regions 6, the electrical component 3 then being placed on the upper side of the cover layer 2 (FIG. 2C), after which the soldering is performed in a solder furnace.

In the illustrated exemplary embodiment, the first regions 10 with raised thermal conductivity consist of a thermally conductive, ceramic paste that lies directly against the contact regions 6 on one side and against the surface of the heat sink 12 on the other side. The second regions 11 of the electrically insulating layer 9 with adhesive effect are formed in the illustrated exemplary embodiment entirely by an electrically insulating adhesive layer. The electrically insulating adhesive does not contain any metal particles, and is therefore, in contrast to the ceramic paste in the first regions 10, significantly less thermally conductive.

As a result of the carrier-free construction of the flexible circuit board 1, the heat is dispersed via the electrical contacts 4 of the light-emitting diode into the conductive track structure 5, and from there dissipated via the first regions 10 of the electrically insulating layer 9 into the heat sink 12.

An indirect thermal connection between the light-emitting diodes and the heat sink by way of cooling surfaces on the lower side thereof, which are arranged separately next to the electrical contacts, is not necessary according to the invention due to the distribution of the electrically insulating layer in first regions 10 with raised thermal conductivity and second regions 11 with adhesive effect.

LIST OF REFERENCE SIGNS

Flexible circuit board 1
Cover layer 2
Electrical component 3
Electrical contacts 4
Conductive track structure 5
Contact regions 6
Openings 7
Solder 8
Electrically insulating layer 9
First regions 10
Second regions 11
Heat sink 12

The invention claimed is:

1. A flexible circuit board comprising:
an cover layer having an upper side, a lower side, and openings, the cover layer being electrically insulating;
an electrical component with electrical contacts arranged on the upper side of the cover layer;
a conductive track structure with contact regions arranged on the lower side of the cover layer, wherein the electrical contacts of the electrical component are each electrically conductively connected to one of the contact regions through respective ones of the openings;
a heat sink thermally conductively connected through the cover layer to the electrical component; and
an electrically insulating layer arranged between the heat sink and the lower side of the cover layer on which the conductive track structure is arranged, wherein the electrically insulating layer electrically insulates the conductive track structure from the heat sink,
wherein the electrically insulating layer includes at least one first region consisting of a material with a thermal conductivity of at least 1 W/(mK) and at least one second region comprising a material with an adhesive effect configured to fasten the cover layer on which the conductive track structure is arranged to the heat sink, the at least one first region being arranged in areas at least under the contact regions of the conductive track structure and the at least one second region is arranged in areas other than the at least one first region,
wherein the at least one first region of the electrically insulating layer underneath at least the contact regions of the conductive track structure is a thermally conductive foil that lies directly against the contact regions on the one side and against the surface of the heat sink on the other side,
wherein the material of the at least one first region does not have the adhesive effect, and
wherein the at least one second region of the electrically insulating layer is a foil having an adhesive layer on both sides.

2. The flexible circuit board as claimed in claim 1, wherein the conductive track structure consists of at least one material from the materials including aluminum, aluminum alloys, copper, copper alloys, tin, and tin alloys.

3. The flexible circuit board as claimed in claim 1, wherein the contact regions are metalized by atmospheric plasmas.

4. The flexible circuit board as claimed in claim 1, wherein the lower side of the cover layer and a surface of the heat sink facing the cover layer are parallel to one another.

5. The flexible circuit board as claimed in claim 1, wherein the at least one second region of the electrically insulating layer has a thickness in a range between 100 μm and 500 μm.

6. The flexible circuit board as claimed in claim 1, wherein the at least one first region of the electrically insulating layer consists of a material with a thermal conductivity of at least 3 W/(mK).

7. The flexible circuit board as claimed in claim 1, wherein the electrical component is light-emitting.

8. The flexible circuit board as claimed in claim 1, wherein the heat sink is a metallic cooling element.

9. The flexible circuit board as claimed in claim 1, wherein the conductive track structure comprises at least one metal foil.

10. The flexible circuit board as claimed in claim 9, wherein the at least one metal foil has a thickness in a range between 50 μm and 300 μm.

11. The flexible circuit board as claimed in claim 9, wherein the at least one metal foil is self-supporting.

12. The flexible circuit board as claimed in claim 1, wherein the cover layer is a carrier layer with the electrical component attached to the upper side and the conductive track structure attached to the lower side.

13. A flexible circuit board comprising:
an cover layer having an upper side, a lower side, and openings, the cover layer being electrically insulating;
an electrical component with electrical contacts arranged on the upper side of the cover layer;
a conductive track structure with contact regions arranged on the lower side of the cover layer, wherein the electrical contacts of the electrical component are each electrically conductively connected to one of the contact regions through respective ones of the openings;

a heat sink thermally conductively connected through the cover layer to the electrical component; and an electrically insulating layer arranged between the heat sink and the lower side of the cover layer on which the conductive track structure is arranged, wherein the electrically insulating layer electrically insulates the conductive track structure from the heat sink, wherein the electrically insulating layer includes at least one first region consisting of a material with a thermal conductivity of at least 1 W/(mK) and at least one second region comprising a material with an adhesive effect configured to fasten the cover layer on which the conductive track structure is arranged to the heat sink, the at least one first region being arranged in areas at least under the contact regions of the conductive track structure and the at least one second region is arranged in areas other than the at least one first region, wherein the at least one second region of the electrically insulating layer is a foil having an adhesive layer on both sides, wherein the material of the at least one first region does not have the adhesive effect, and wherein the at least one first region of the electrically insulating layer with a thermal conductivity of at least 1 W/(mK) is a thermally conductive paste with one side that lies against the contact regions and another side that lies against the surface of the heat sink.

* * * * *